US009682510B2

United States Patent
Torii et al.

(10) Patent No.: US 9,682,510 B2
(45) Date of Patent: Jun. 20, 2017

(54) IMPRINT APPARATUS AND METHOD OF MANUFACTURING ARTICLE

(71) Applicant: CANON KABUSHIKI KAISHA, Tokyo (JP)

(72) Inventors: Hirotoshi Torii, Utsunomiya (JP); Yusuke Tanaka, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 769 days.

(21) Appl. No.: 13/866,151

(22) Filed: Apr. 19, 2013

(65) Prior Publication Data
US 2013/0300031 A1  Nov. 14, 2013

(30) Foreign Application Priority Data

May 8, 2012 (JP) .................................. 2012-107035
Apr. 3, 2013 (JP) .................................. 2013-078096

(51) Int. Cl.
B29C 59/02 (2006.01)
G03F 7/00 (2006.01)

(52) U.S. Cl.
CPC .......... B29C 59/026 (2013.01); G03F 7/0002 (2013.01)

(58) Field of Classification Search
CPC ........................... B29C 59/02; B29C 59/026
USPC .......................................... 264/293; 425/385
See application file for complete search history.

(56) References Cited

U.S. PATENT DOCUMENTS

| 8,215,946 | B2 | 7/2012 | GanapathiSubramanian et al. |
| 2005/0270516 | A1* | 12/2005 | Cherala ................. B82Y 10/00 355/72 |
| 2011/0262652 | A1* | 10/2011 | Dokai ................... B29C 43/021 427/510 |
| 2012/0007279 | A1* | 1/2012 | Torii ..................... B29C 33/303 264/293 |

(Continued)

FOREIGN PATENT DOCUMENTS

| JP | 2007296783 A | 11/2007 |
| JP | 2010-080714 A | 4/2010 |
| JP | 2012023092 A | 2/2012 |

(Continued)

OTHER PUBLICATIONS

Office Action issued in KR10-2013-0047518, mailed Jan. 21, 2016.

(Continued)

Primary Examiner — Christina Johnson
Assistant Examiner — Xue Liu
(74) Attorney, Agent, or Firm — Rossi, Kimms & McDowell LLP

(57) ABSTRACT

The present invention provides an imprint apparatus which performs an imprint process in which a resin on a substrate is cured while a mold having a pattern formed thereon is pressed against the resin to transfer the pattern onto the substrate, the apparatus comprising a changing unit which includes a contact member having a contact surface that comes into contact with a side surface of the mold, and is configured to apply a force to the side surface of the mold through the contact member to change a shape of the pattern formed on the mold, and an adjusting unit configured to change at least one of an angle and a position of the contact member to adjust a contact state between the contact surface and the side surface of the mold.

27 Claims, 11 Drawing Sheets

(56) References Cited

U.S. PATENT DOCUMENTS

2012/0086149 A1* 4/2012 Yoshida ................ B82Y 10/00
264/293

FOREIGN PATENT DOCUMENTS

| JP | 2012507138 A | 3/2012 |
|---|---|---|
| KR | 200210931 Y1 | 1/2001 |
| KR | 1020110119538 A | 11/2011 |

OTHER PUBLICATIONS

Office Action issued in KR10-2013-0047518, mailed Aug. 24, 2015.
Office Action issued in Japanese patent application No. 2013078096 mailed Jan. 5, 2017.

* cited by examiner

F I G. 2
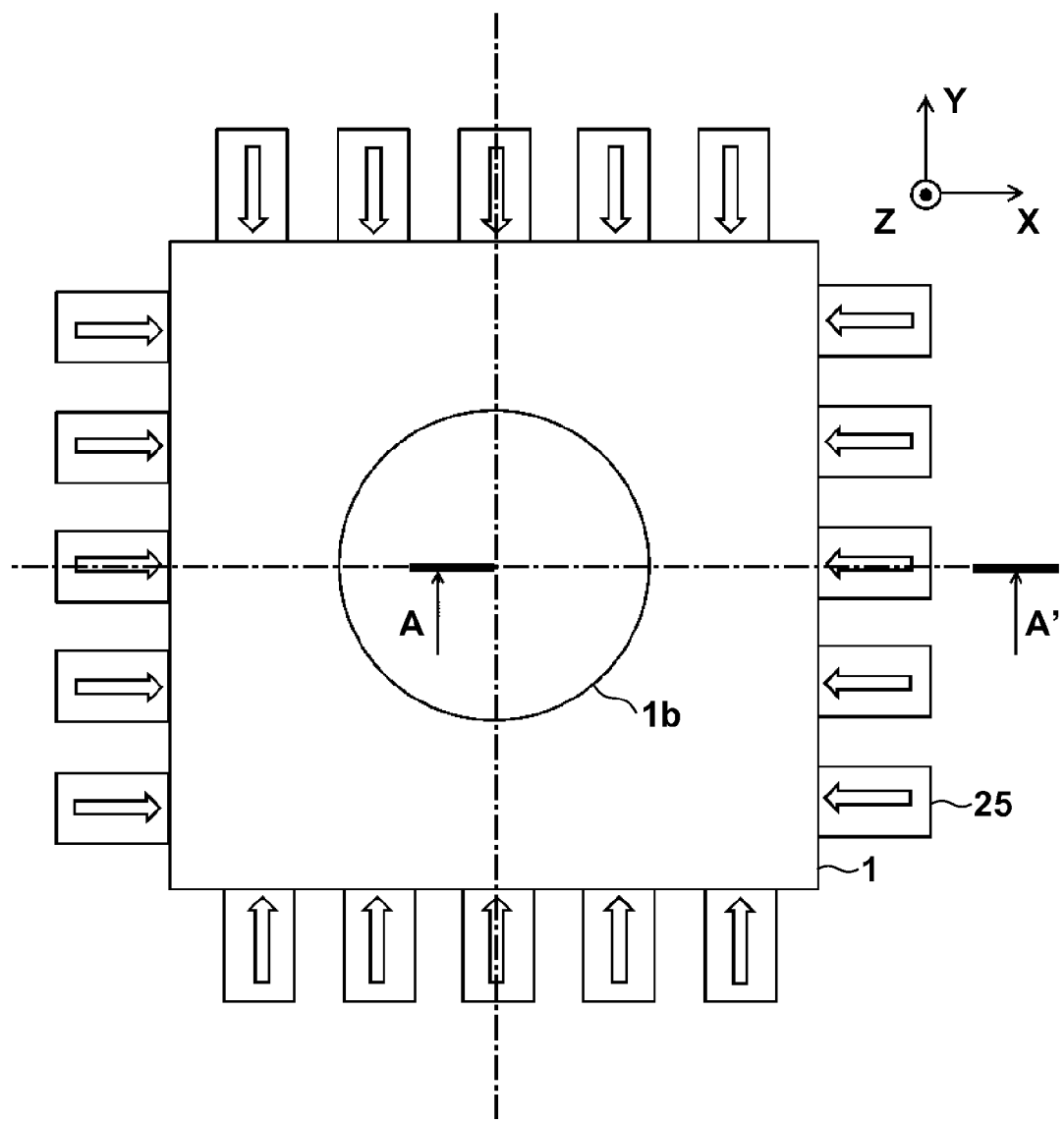

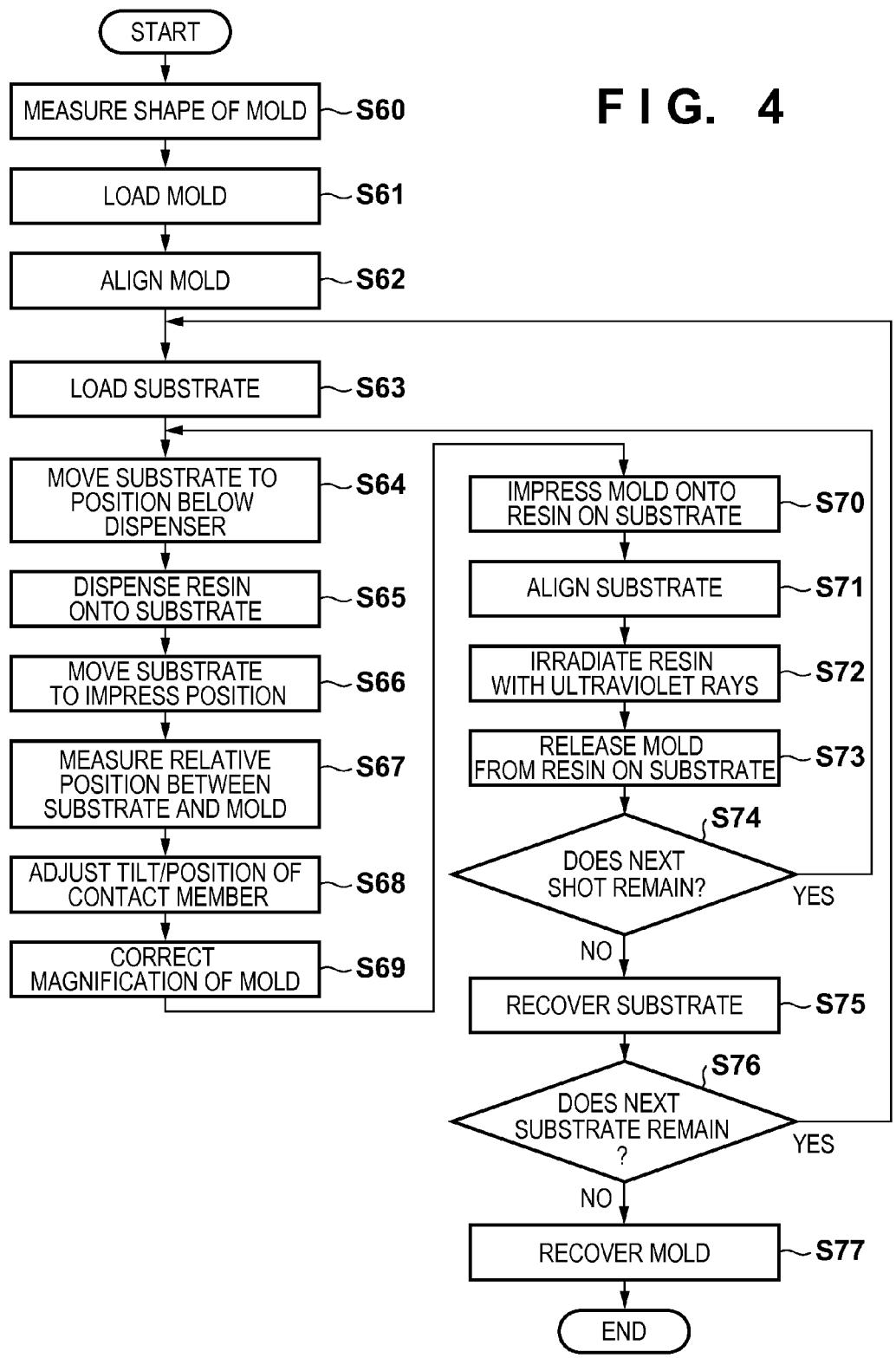

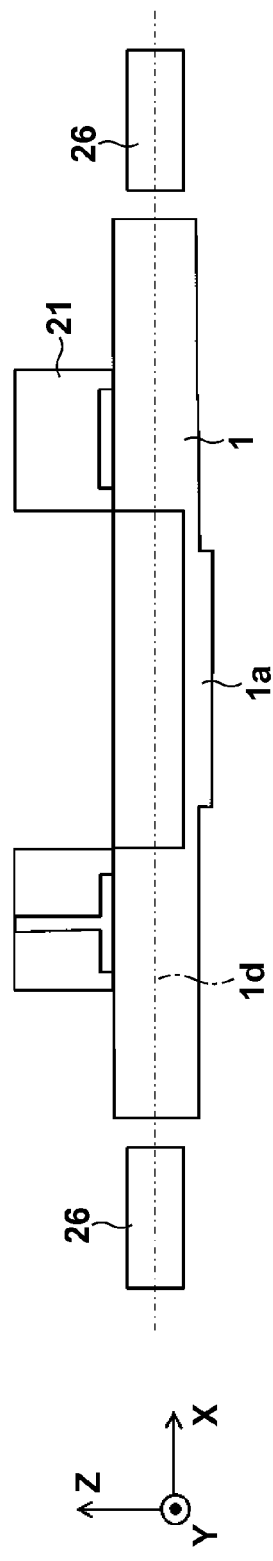
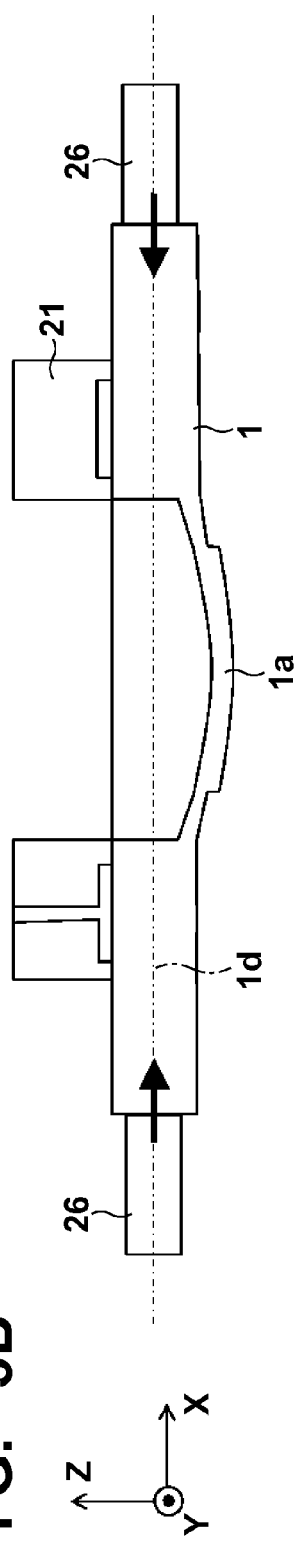

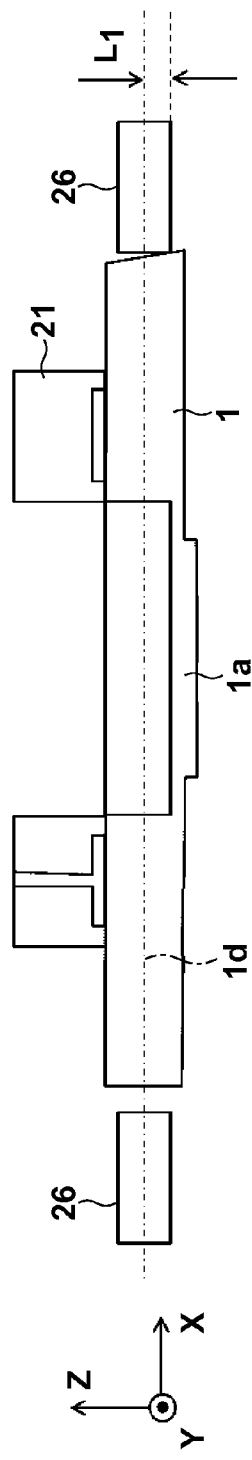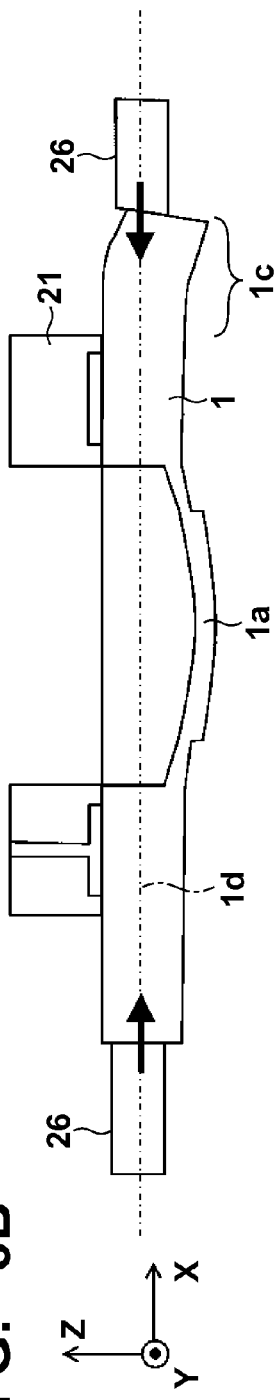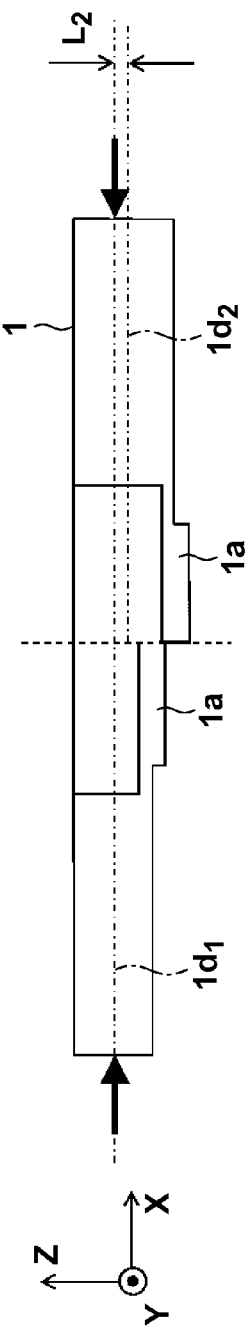

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

The imprint technique is attracting a great deal of attention as one of nano-lithography techniques for volume production of, for example, magnetic storage media and semiconductor devices. In the imprint technique, a mold having a fine pattern formed on it is pressed against a resin supplied onto a substrate, and the resin is cured in this state. By separating the mold from the cured resin, the pattern of the mold can be transferred onto the substrate.

In the imprint technique for manufacturing, for example, a semiconductor device, it is a common practice to use a plurality of molds to form a plurality of patterns on top of each other on a substrate. Hence, in an imprint apparatus which uses this technique, it is important to overlay the pattern of a mold on that of a substrate with high accuracy, so magnification correction in which the size of a pattern formed on a mold is corrected by pressing a plurality of portions on the side surface of the mold is performed. However, since the plurality of portions on the side surface of the mold have different shapes, a force may act in a direction, different from that in which the mold is pressed, when all portions are pressed in the same manner. If such a force acts, distortion may occur in the pattern of the mold, thus making it difficult to overlay the pattern of the mold on that of the substrate with high accuracy. To prevent this problem, Japanese Patent Laid-Open No. 2010-80714 describes a method of providing a plurality of holding units which hold a plurality of portions in the outer peripheral region of the mold, and independently driving the respective holding units in a direction (Z-direction) perpendicular to the substrate surface to correct the shape of the mold in accordance with that of the substrate.

An imprint apparatus described in Japanese Patent Laid-Open No. 2010-80714 uses a plurality of holding units to hold a mold in a plurality of portions of the outer peripheral region of the mold, and independently drives the respective holding units in the Z-direction to improve the overlay accuracy. Unfortunately, in such an imprint apparatus, the respective holding portions drive the respective portions of the mold in different amounts in the Z-direction (a direction perpendicular to the substrate surface), so the mold has a complicatedly distorted shape. That is, correcting the shape of the mold in accordance with that of the substrate improves the overlay accuracy, but leads to insufficient magnification correction of the pattern formed on the mold. Therefore, to overlay the pattern of the mold on that of the substrate with high accuracy, it is necessary to perform magnification correction while efficiently suppressing distortion generated by each holding unit. Further, since magnification correction must be done with high accuracy by increasing the number of portions where forces are applied to the mold, it is necessary to simplify a mechanism which performs magnification correction.

SUMMARY OF THE INVENTION

The present invention provides a technique advantageous in terms of accurately transferring the pattern of a mold onto a substrate in an imprint apparatus.

According to one aspect of the present invention, there is provided an imprint apparatus which performs an imprint process in which a resin on a substrate is cured while a mold having a pattern formed thereon is pressed against the resin to transfer the pattern onto the substrate, the apparatus comprising: a changing unit which includes a contact member having a contact surface that comes into contact with a side surface of the mold, and is configured to apply a force to the side surface of the mold through the contact member to change a shape of the pattern formed on the mold; and an adjusting unit configured to change at least one of an angle and a position of the contact member to adjust a contact state between the contact surface and the side surface of the mold.

Further features of the present invention will become apparent from the following description of exemplary embodiments with reference to the attached drawings.

BRIEF DESCRIPTION OF THE DRAWINGS

FIG. 2 is a plan view of a mold as viewed from the side of irradiation with ultraviolet rays in the first embodiment;

FIG. 4 is a flowchart showing an operation sequence in an imprint process according to the first embodiment;

FIGS. 5A and 5B are sectional views showing cross-sections of an ideal mold;

FIGS. 6A and 6B are sectional views showing cross-sections of the mold in the first embodiment;

FIG. 7 is a sectional view showing a cross-section of the mold in the first embodiment;

DESCRIPTION OF THE EMBODIMENTS

Figure 1:
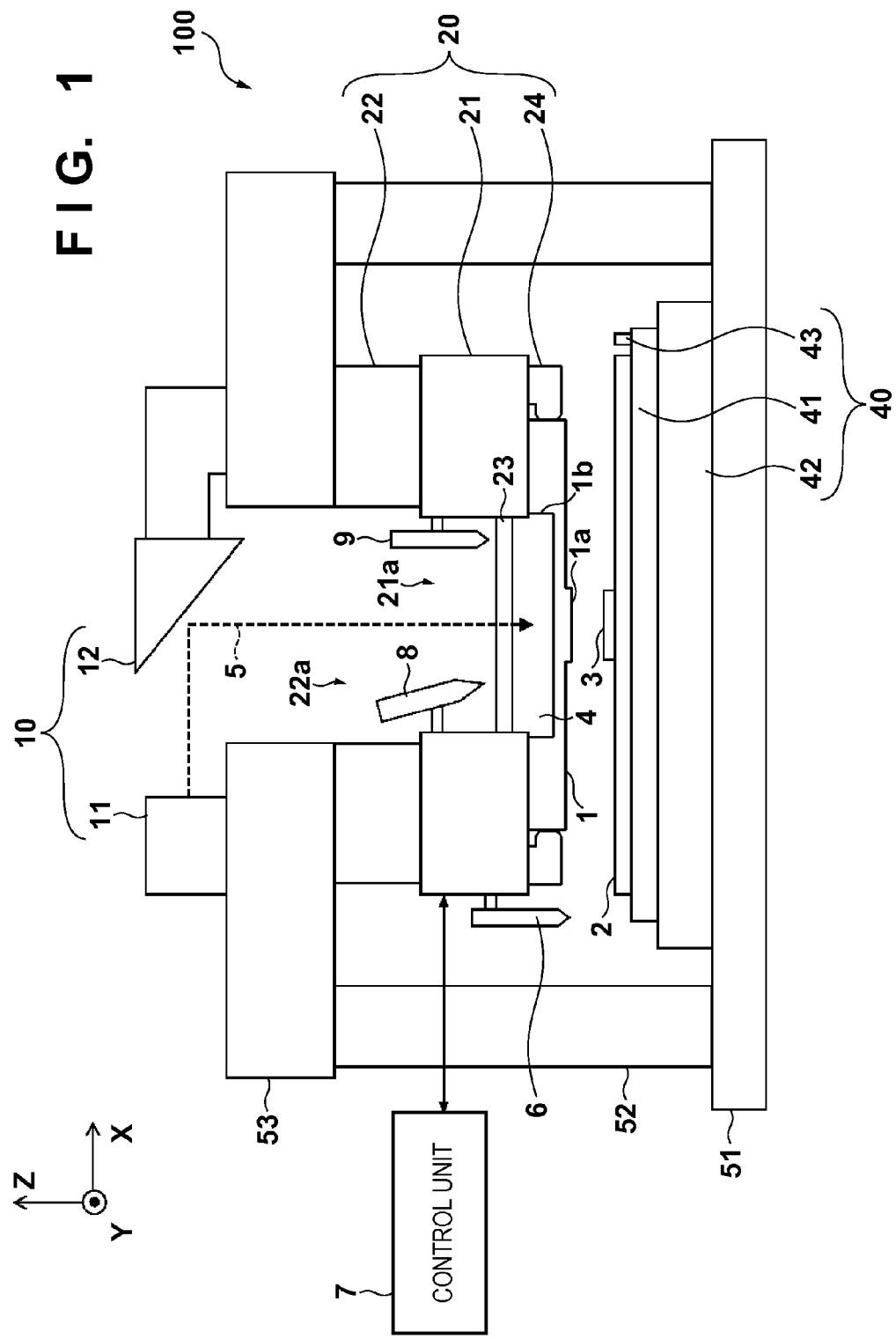
FIG. 1 is a view showing the configuration of an imprint apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An imprint apparatus 100 according to the first embodiment of the present invention will be described with reference to FIG. 1. The imprint apparatus performs an imprint process which is used to manufacture, for example, a semiconductor device, and in which a resin on a substrate is cured while a mold having a pattern formed on it is pressed against the resin, and the mold is separated from the cured resin to transfer the pattern onto the substrate. The imprint apparatus 100 according to the first embodiment includes a light irradiation unit 10 which irradiates a resin 3 on a substrate 2 with ultraviolet rays 5, a mold holding unit 20 which holds a mold 1, a substrate stage 40 which holds the substrate 2, and a dispenser 6 which dispenses the resin 3 onto the substrate 2. The mold holding unit 20 is fixed to a bridge plate 53 supported by a base plate 51 through a support column 52, and the substrate stage 40 is fixed to the base plate 51. The imprint apparatus 100 also includes a control unit 7 which systematically controls an imprint process. Note that the imprint apparatus 100 according to the first embodiment employs the photo-curing method of curing a resin by irradiating it with ultraviolet rays. Also, in the following drawings, orthogonal directions on the substrate surface are defined as the X- and Y-directions, and a direction perpendicular to the substrate surface is defined as the Z-direction.

The mold 1 is generally made of a material capable of transmitting ultraviolet rays, such as quartz, and an unevenness pattern 1a to be transferred onto the substrate 2 is partially formed in its surface on the side of the substrate 2. A cylindrical cavity (concave portion) 1b is formed in a surface, which holds the mold 1, so as to reduce the thickness of the portion having the pattern 1a formed in it. The cavity 1b serves as an almost airtightly sealed space 4 by a light-transmissive member 23 disposed in an aperture region 21a in a mold chuck 21 (to be described later), and the pressure in the space 4 is controlled by a pressure adjustment apparatus (not shown). In, for example, pressing the mold 1 against the resin 3 on the substrate 2, the pressure in the space 4 is set higher than the external pressure of the space 4. At this time, the pattern 1a of the mold 1 deforms into a convex shape bulged toward the substrate 2, so the pattern 1a can be brought into contact with the resin 3 from its central portion. This prevents the gas (air) from being entrapped in the gap between the pattern 1a and the resin 3, thus making it possible to fill the unevenness portions of the pattern 1a with the resin 3 throughout its length and breadth so as to prevent loss of the pattern transferred onto the substrate 2. Note that the depth of the cavity 1b is appropriately set in accordance with the size and material of the mold 1.

A single-crystal silicon substrate or an SOI (Silicon On Insulator) substrate, for example, is used as the substrate 2. An ultraviolet-curing resin (to be referred to as the resin 3 hereinafter) is dispensed onto the upper surface (the surface to be processed) of the substrate 2 by the dispenser 6 (to be described later), and the mold 1 is pressed against the resin 3 dispensed on the substrate 2. By irradiating the resin 3 with ultraviolet rays while the mold 1 is pressed against the resin 3, the resin 3 cures. The mold 1 is separated from the cured resin 3.

The light irradiation unit 10 includes a light source 11 and optical element 12, and irradiates the resin 3 on the substrate 2 with the ultraviolet rays 5 through the mold 1 in an imprint process. The light source 11 emits the ultraviolet rays 5 to cure the resin 3 dispensed on the substrate 2, and the optical element 12 is implemented by a mirror which bends the ultraviolet rays 5 emitted by the light source 11. In the first embodiment, the mold 1 having the pattern 1a formed on it is brought into contact with the resin 3 on the substrate 2, and the resin 3 on the substrate 2 is irradiated with the ultraviolet rays 5 from the light source 11 in this state to be cured. Although the imprint apparatus 100 according to the first embodiment is provided with the light irradiation unit 10 to employ the photo-curing method, it may be equipped with a heat source unit for curing a thermosetting resin, in place of the light irradiation unit 10, when, for example, the heat-curing method is employed.

The mold holding unit 20 includes the mold chuck 21 which holds the mold 1 by, for example, a vacuum absorption force or an electrostatic force, and a mold driving unit 22 which drives the mold chuck 21 to move the mold 1. Aperture regions 21a and 22a are formed at the central portions (on the inner sides) of the mold chuck 21 and mold driving unit 22, respectively, so as to irradiate the resin 3 on the substrate 2 with the ultraviolet rays 5 emitted by the light source 11 of the light irradiation unit 10. The light-transmissive member 23 which transmits ultraviolet rays is disposed in the aperture region 21a of the mold chuck 21, and allows the cavity 1b in the mold 1 to serve as an almost airtightly sealed space. The mold holding unit 20 also includes a changing unit 24 which applies a force to the side surface of the mold 1 to change the shape of the pattern 1a formed on the mold 1. The changing unit 24 applies a force to the side surface of the mold 1 to change the shape of the pattern 1a, thereby performing magnification correction in which the size of the pattern 1a formed on the mold 1 is corrected with respect to the pattern formed on the substrate 2 in advance.

The mold driving unit 22 includes, for example, an actuator such as a linear motor or an air cylinder, and moves the mold 1 in the Z-direction so as to press the mold 1 against the resin 3 on the substrate 2 or separate it from the resin 3. Note that since the mold driving unit 22 controls the position of the mold 1 with high accuracy, it may be implemented by a plurality of driving systems including a coarse driving system and fine driving system. The mold driving unit 22 may also have, for example, a position adjustment function of adjusting the position of the mold 1 by driving it in orthogonal directions (X- and Y-directions) on the substrate surface, and rotating it in the θ-direction, and a tilt function for correcting the tilt of the mold 1. Although an operation of bringing the mold 1 and substrate 2 close to each other and separating them from each other is performed by the mold driving unit 22 in the imprint apparatus 100 according to the first embodiment, it may be performed by the substrate stage 40 (to be described later) or by both of them relative to each other.

The substrate stage 40 includes a substrate chuck 41 and stage driving unit 42, and moves the substrate 2 in the X-Y plane to align the mold 1 and substrate 2 in pressing the mold 1 against the resin 3 on the substrate 2. The substrate chuck 41 holds the substrate 2 by, for example, vacuum absorption, and includes a reference mark 43 used to align the mold 1. The stage driving unit 42 mechanically holds the substrate chuck 41 to be movable in the X-Y plane. The stage driving unit 42 uses, for example, a linear motor, and may be implemented by a plurality of driving systems including a coarse driving system and fine driving system in the X- and Y-directions. The stage driving unit 42 may also have, for example, a position adjustment function of adjusting the position of the substrate 2 by driving it in orthogonal directions (X- and Y-directions) on the substrate surface, and rotating it in the θ-direction, and a tilt function for correcting the tilt of the substrate 2.

The dispenser 6 dispenses the resin 3 (uncured resin) onto the substrate 2. As described above, the resin 3 used in the first embodiment is a photo-curing resin (imprint material) having the property that it cures upon irradiation with the ultraviolet rays 5, and is appropriately selected in accordance with various conditions in the process of manufacturing a semiconductor device. Also, the amount of the resin 3 discharged from discharge nozzles of the dispenser 6 is appropriately determined in accordance with, for example, the thickness or density of an unevenness pattern formed upon the resin 3 on the substrate 2.

The control unit 7 controls, for example, operations and adjustment in each constituent element of the imprint apparatus 100. The control unit 7 is implemented by, for example, a computer, and connected to each constituent element of the imprint apparatus 100. The imprint apparatus 100 also includes an alignment measurement unit 8 which measures a position deviation between alignment marks on the mold 1 and substrate 2, respectively, and a distance measurement unit 9 which measures the distance between the mold 1 and the substrate 2. As wafer alignment, the alignment measurement unit 8 measures, for example, a position deviation, in the X- and Y-directions, between the alignment marks formed on the substrate 2 and mold 1, respectively. The distance measurement unit 9 measures, for example, the distance by observing, using an image sensor, interfering light generated as light emitted toward the substrate 2 by a light source for measurement passes through the mold 1, is reflected by the substrate 2, and passes through the mold 1 again, thereby bringing about interference.

The changing unit 24 which applies a force to the side surface of the mold 1 to change the shape of the pattern 1a formed on the mold 1 will be described herein with reference to FIGS. 2 and 3. FIG. 2 is a plan view of the mold 1 as viewed from the side of irradiation with the ultraviolet rays 5. The mold 1 includes five changing units 24 on each side, that is, a total of 20 changing units 24, and inward forces are applied to the changing units 24 from the side surface of the mold 1, as indicated by arrows in the changing units 24 shown in FIG. 2. With this arrangement, by providing a plurality of changing units 24 on each side of the mold 1, magnification correction of the pattern 1a formed on the mold 1 with respect to the pattern formed on the substrate 2 in advance can be performed with high accuracy.

Figure 3:
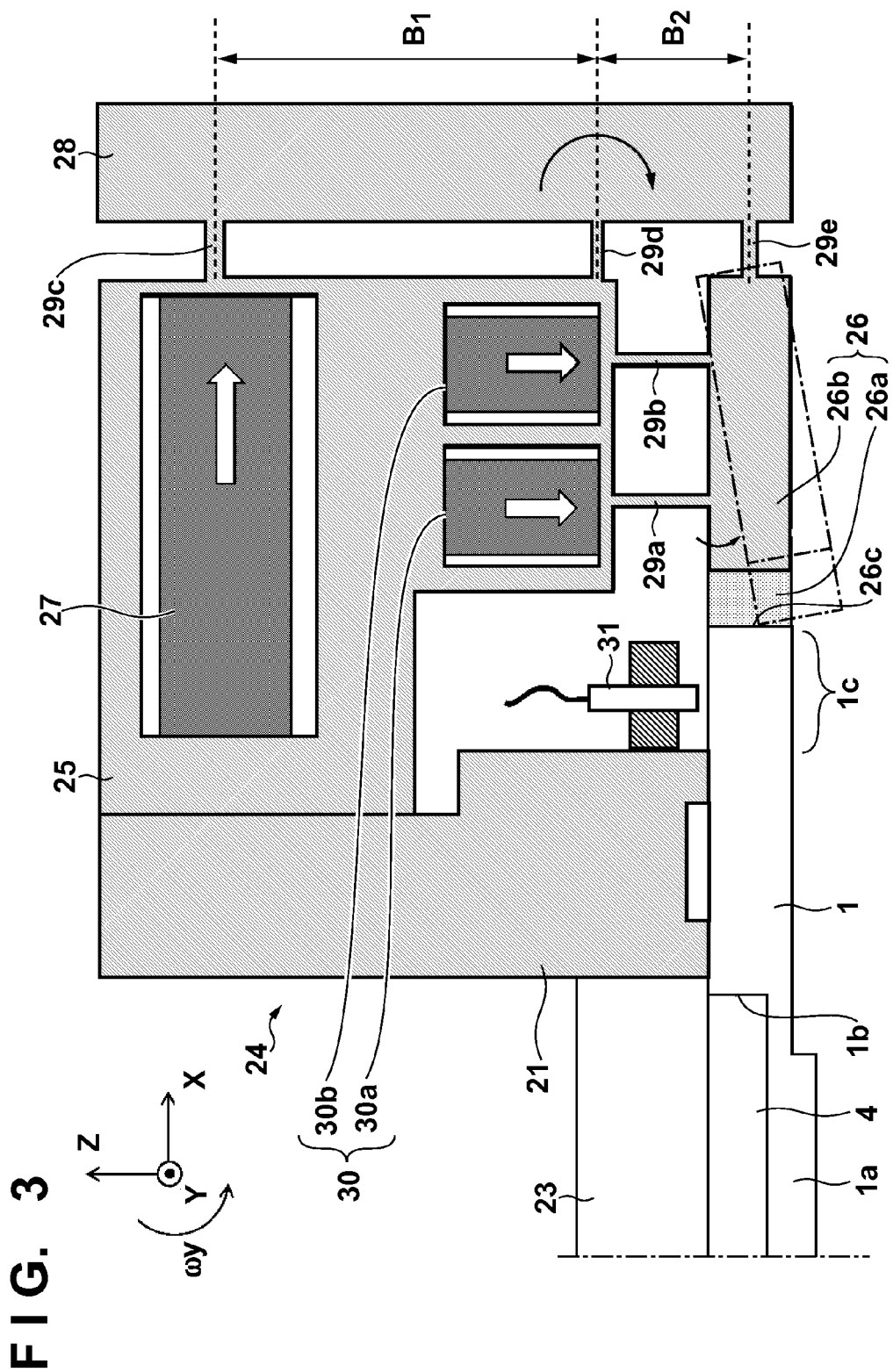
FIG. 3 is a sectional view showing a cross-section of a changing unit in the first embodiment.

FIG. 3 is a sectional view showing a cross-section of the mold 1 and changing unit 24 corresponding to an interval A-A' shown in FIG. 2. The changing unit 24 includes a base unit 25, a contact member 26, an actuator 27, a lever 28, and a plurality of members 29a to 29e. The base unit 25 is fixed to the mold holding unit 20 (mold chuck 21) and includes the actuator 27. Upon applying a force to the side surface of the mold 1, the base unit 25 receives a reaction force to that force. The contact member 26 is formed by a resin member 26a and block member 26b. The resin member 26a has a contact surface 26c which comes into contact with the side surface of the mold 1, and uses a resin with excellent elasticity, such as polytetrafluoroethylene (PTFE) or polyoxymethylene (POM), to reduce stress concentration on the mold 1 so as to prevent a fracture of the mold 1. The block member 26b is formed integrally with the resin member 26a, and supported by the base unit 25 through the members 29a and 29b. The members 29a and 29b are implemented by, for example, leaf springs, and form a link mechanism which allows the contact member 26 to move in the direction (first direction) in which the contact member 26 presses the mold 1. The actuator 27 is disposed in the base unit 25, and the contact member 26 applies a force to the member 29c in a direction (X-direction) opposite to that (first direction) in which the contact member 26 presses the mold 1 to displace the member 29c in the X-direction, as indicated by an arrow in FIG. 3. The lever 28 is supported by the base unit 25 through the members 29c, 29d, and 29e. The members 29c, 29d, and 29e can be implemented by, for example, leaf springs, like the members 29a and 29b.

When a force is generated in the X-direction by the actuator 27, it is transmitted to the upper portion of the lever 28 through the member 29c, so the upper portion of the lever 28 is displaced in the X-direction. At this time, the lever 28 rotates using the member 29d as a fulcrum, and the rotated lever 28 converts a displacement of the upper portion of the lever 28 in the X-direction into that of the lower portion of the lever 28 in the -X-direction. A displacement of the lower portion of the lever 28 in the -X-direction is transmitted to the contact member 26 through the member 29e to move the contact member 26 in the direction (-X-direction) in which the contact member 26 presses the mold 1. The ratio (driving magnification) between the displacements of the upper and lower portions of the lever 28 is determined by a distance $B_1$ between the members 29c and 29d, and a distance $B_2$ between the members 29d and 29e, and is $B_2/B_1$. The block member 26b of the contact member 26 is supported by the base unit 25 through the members 29a and 29b which form the link mechanism, and allows the mold 1 to move in the direction (-X-direction) in which the mold 1 is pressed, while suppressing displacements of the mold 1 in directions other than the -X-direction. Also, the resin member 26a of the contact member 26 brings the contact surface 26c into contact with the side surface of the mold 1 to apply a force to the side surface of the mold 1. The force can be monitored by, for example, a distortion sensor, a force sensor, or a displacement sensor (neither is shown). Although a piezoelectric actuator is used as the actuator 27 according to the first embodiment in consideration of the generated force, resolution, and response, an air cylinder or an electromagnetic motor, for example, may also be used.

The changing units 24 configured as mentioned above perform magnification correction in which the size of the pattern 1a formed on the mold 1 is corrected by pressing a plurality of portions on the side surface of the mold 1, as shown in FIG. 2. However, since the plurality of portions on the side surface of the mold 1 have different shapes, a force may act in a direction, different from that in which the mold 1 is pressed, when all portions are pressed in the same manner, without adjusting either the angle or position of the contact member 26. If such a force acts, stress concentration may occur locally in the pattern 1a of the mold 1 to generate distortion, thus making it difficult to overlay the pattern 1a of the mold 1 on that of the substrate with high accuracy. To prevent this problem, the changing unit 24 according to the first embodiment is provided with an adjusting unit 30 which adjusts the angle and position of the contact member 26. The adjusting unit 30 is formed by actuators 30a and 30b which apply displacements in the Z-direction to the members 29a and 29b, respectively. The actuators 30a and 30b are arranged in the base unit 25, and drive the members 29a and 29b, respectively, in a direction (second direction (-Z-direction)) different from that (first direction) in which the contact member 26 presses the mold 1. This makes it possible to change the angle in the ωy-direction and the position in the Z-direction for the contact member 26. If, for example, only the member 29a is displaced in the Z-direction by the actuator 30a, the angle of the contact member 26 can be changed, as indicated by an alternate long and two short dashed line in FIG. 3. However, if the members 29a and 29b are displaced in the same amount in the Z-direction by the actuators 30a and 30b, respectively, the position of the contact member 26 in the Z-direction can be changed without changing the angle of the contact member 26. With this arrangement, the changing unit 24 according to the first embodiment can adjust at least one of the angle and position of the contact member 26, and it can adjust the contact state between the contact surface 26c of the contact member 26 (resin member 26a) and the side surface of the mold 1. That is, a force can be applied to the side surface of the mold 1 by adjusting the contact surface 26c so that the contact surface 26c is set parallel to the side surface of the mold 1, and the center of the contact surface 26c is set at the neutral position of rigidity of the mold 1 in the Z-direction. The neutral position of rigidity (to be referred to as the neutral position 1*d* hereinafter) means herein the position at which the moment of rotation that acts on the mold 1 minimizes as a force is applied to the side surface of the mold 1.

The driving amounts required for the actuators 30*a* and 30*b* to adjust the contact member 26 can be determined by measuring, in advance, the shape information of the mold 1 used, using, for example, a three-dimensional measurement device, before the mold 1 is loaded into the imprint apparatus 100. The shape information of the mold 1 can include at least one of, for example, the thickness of the mold 1, and the tilt of the side surface of the mold 1. The driving amounts required for the actuators 30*a* and 30*b* to adjust the contact member 26 can also be determined based on the deformation amount of an outer peripheral region 1*c* of the mold 1. In this case, a measurement unit 31 which measures the deformation amount in which the outer peripheral region 1*c* of the mold 1 deforms in a direction (−Z-direction) different from that in which the mold 1 is pressed is provided in the imprint apparatus 100. A force generated by the actuator 27 is applied to the side wall of the mold 1 through the contact member 26, and the actuators 30*a* and 30*b* are driven to reduce the deformation amount of the outer peripheral region 1*c* of the mold 1, which is measured by the measurement unit 31. At this time, by finely adjusting the driving amounts of the actuators 30*a* and 30*b*, the influence of, for example, an assembly error of the apparatus can also be suppressed. The outer peripheral region 1*c* of the mold 1 means herein a region that falls outside the portion where the mold 1 is held by the mold holding unit 20 (mold chuck 21).

The driving amounts required for the actuators 30*a* and 30*b* to adjust the contact member 26 can also be determined based on a position deviation between the alignment marks formed on the mold 1 and substrate 2, respectively. In this case, the aperture region 21*a* in the mold chuck 21 is provided with the alignment measurement unit 8 which measures a position deviation, in the X- and Y-directions, between the alignment marks formed on the mold 1 and substrate 2, respectively, as shown in FIG. 1. The actuators 30*a* and 30*b* are driven to reduce the position deviation measured by the alignment measurement unit 8.

An imprint process in which the pattern 1*a* of the mold 1 is transferred onto the substrate 2 in the imprint apparatus 100 according to the first embodiment, configured as mentioned above, will be described with reference to FIG. 4. FIG. 4 is a flowchart showing an operation sequence in an imprint process in which the unevenness pattern 1*a* formed on the mold 1 is transferred onto a plurality of substrates 2.

In step S60, before the mold 1 is loaded into the imprint apparatus 100, the shape of the mold 1 is measured in advance by, for example, a three-dimensional measurement device to obtain the shape information of the mold 1. In step S61, the control unit 7 controls a mold conveyance mechanism (not shown) to convey the mold 1 to a position below the mold chuck 21, and controls the mold chuck 21 to hold the mold 1. With this operation, the mold 1 is loaded into the imprint apparatus 100. In step S62, the control unit 7 uses the alignment measurement unit 8 to measure a position deviation, in the X-, Y-, and θ-directions, between the reference mark 43 and the alignment mark formed on the mold 1. The control unit 7 controls the mold driving unit 22 to align the reference mark 43 and the alignment mark formed on the mold 1, based on the measurement result obtained by the alignment measurement unit 8. In step S63, the control unit 7 controls a substrate conveyance mechanism (not shown) to convey the substrate 2 onto the substrate chuck 41, and controls the substrate chuck 41 to hold the substrate 2. With this operation, the substrate 2 is loaded into the imprint apparatus 100. In step S64, the control unit 7 controls the stage driving unit 42 to set a shot region (a region to undergo an imprint process) on the substrate 2 at a position below the dispenser 6 to move the substrate 2. In step S65, the control unit 7 controls the dispenser 6 to dispense a resin 3 (uncured resin) to the shot region on the substrate 2. In step S66, the control unit 7 controls the stage driving unit 42 to set the shot region on the substrate 2, dispensed with the resin 3, at a position below the pattern 1*a* of the mold 1 to move the substrate 2. In step S67, the control unit 7 controls the alignment measurement unit 8 to measure a position deviation between the alignment marks formed on the substrate 2 and mold 1, respectively, during or after the movement of the substrate 2. Based on the measurement result obtained by the alignment measurement unit 8, the control unit 7 calculates the driving amount of the actuator 27, which is required for the changing unit 24 (contact member 26) to press the mold 1 from its side surface, in magnification correction of the pattern 1*a* formed on the mold 1. In step S68, the control unit 7 controls the actuators 30*a* and 30*b* to adjust the angle and position of the contact member 26. The control unit 7 calculates the driving amounts of the actuators 30*a* and 30*b* based on the shape information of the mold 1 measured in advance in step S60. In step S69, the control unit 7 drives the actuator 27 based on the driving amount of the actuator 27, which is calculated in step S67, to apply a force to the side surface of the mold 1 through the contact member 26. With this operation, the shape of the mold 1 is changed to perform magnification correction of the pattern 1*a* of the mold 1. Note that the processes in steps S68 and S69 may also be executed in or after pressing the mold 1 against (impressing it onto) the resin 3 on the substrate 2 in step S70 (to be described later). Also, the process in step S68 may be executed in or after magnification correction of the pattern 1*a* of the mold 1 in step S69.

The shape of the mold 1 as the changing unit 24 applies a force to the side surface of the mold 1 will be described herein. FIGS. 5A and 5B are views showing the shapes of an ideal mold before and after the changing unit 24 applies a force to the side surface of the mold 1. The ideal mold 1 is formed so that all portions on the side surface of the mold 1 are parallel to the Z-axis, and are uniform in the thickness of the outer peripheral region 1*c* of the mold 1, as shown in FIG. 5A. Using such an ideal mold 1, the contact surface 26*c* of the contact member 26 is set parallel to the side surface of the mold 1, and the center of the contact surface 26*c* is set at the neutral position 1*d* of the mold 1, without adjusting the contact member 26. When the changing units 24 apply forces to the side surface of the ideal mold 1, the thin portion of the pattern 1*a* in the ideal mold 1 deforms into a convex shape bulged toward the substrate 2, as shown in FIG. 5B. However, an actual mold often has a side surface that is not parallel to the Z-direction, as shown in FIG. 6A, or has a thickness that varies due, for example, to the differences between individual molds, as shown in FIG. 7. Referring to FIG. 7, the left side of a broken line shows the case wherein the mold 1 is fabricated with a thickness smaller than a design value, and the right side of the broken line shows the case wherein it is fabricated with a thickness larger than the design value.

In a mold 1 having a side surface that is not parallel to the Z-axis, as shown in FIG. 6A, when a force is applied to its side surface, the contact member 26 comes into contact with the side surface of the mold 1 from a position spaced apart from the neutral position $1d$ by a distance $L_1$ in the –Z-direction. When a force is applied to the side surface of the mold 1 in such a contact state, the outer peripheral region $1c$ of the mold 1 deforms in the –Z-direction or in a bilaterally asymmetric shape, as shown in FIG. 6B. When the outer peripheral region $1c$ of the mold 1 has deformed, distortion occurs in the pattern $1a$ of the mold 1, so the pattern $1a$ of the mold 1 cannot be overlaid on that of the substrate 2 with high accuracy. Also, as shown in FIG. 7, in a mold 1 with a thickness that varies due, for example, to the differences between individual molds, the portions on the left and right sides of the broken line have neutral positions $1d_1$ and $1d_2$ spaced apart from each other by a distance $L_2$. Therefore, when a force is applied to the side surface of the mold 1 without adjusting the contact member 26, the mold 1 deforms in the same manner as in FIG. 6B. To prevent this problem, in the imprint apparatus 100 according to the first embodiment, the changing unit 24 includes the actuators $30a$ and $30b$, which adjust at least one of the angle ωy and the position, in the Z-direction, of the contact member 26, as described above. This makes it possible to adjust the angle of the contact member 26 so that the contact surface $26c$ of the contact member 26 becomes parallel to the side surface of the mold 1, and, in turn, to adjust the center of the contact surface $26c$ to the neutral position $1d$ of the mold 1. That is, it is possible to adjust the contact state between the side surface of the mold 1 and the contact surface $26c$ of the contact member 26.

Figure 8:
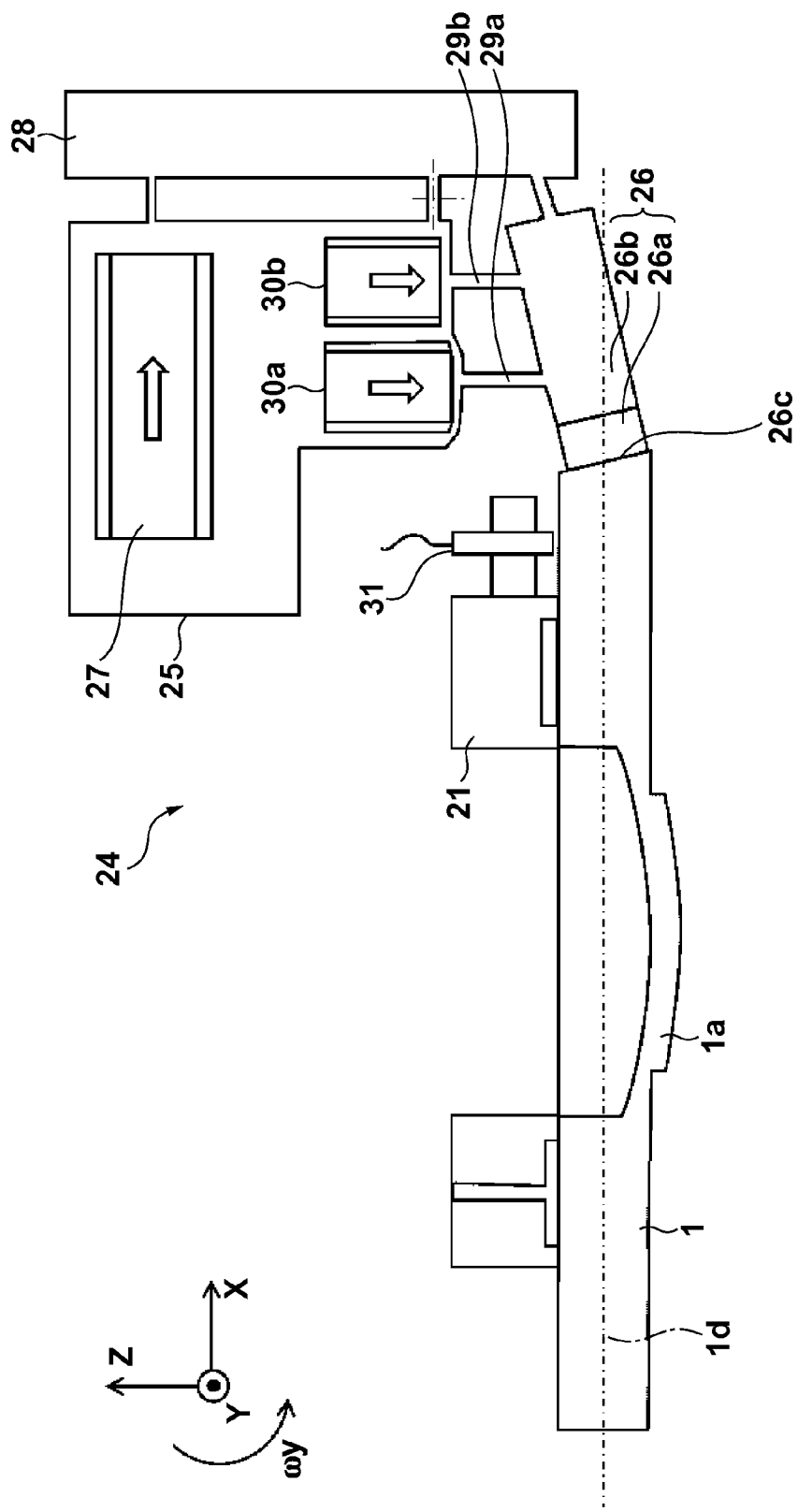
FIG. 8 is a sectional view showing a cross-section of the changing unit in the first embodiment.

A method of adjusting the angle ωy and the position, in the Z-direction, of the contact member 26 with respect to a mold 1 having a shape as shown in FIG. 6A will be described with reference to FIG. 8. The shape of the mold 1 is measured in advance using, for example, a three-dimensional measurement device, as described in step S60, and the contact member 26 is adjusted based on the measurement result. The side surface of the mold 1 used in FIG. 8 has an inclined shape instead of a shape parallel to the Z-axis. First, the angle ωy of the contact member 26 is adjusted so that the contact surface $26c$ of the contact member 26 becomes parallel to the inclined side surface of the mold 1. More specifically, only the actuator $30a$ is activated while the actuator $30b$ is kept stopped. With this operation, only the member $29a$ is displaced in the –Z-direction without displacing the member $29b$, and the portion on the side of the contact surface $26c$ of the contact member 26 descends in the –Z-direction, so the angle ωy of the contact member 26 is adjusted so that the contact surface $26c$ of the contact member 26 becomes parallel to the side surface of the mold 1. The position of the contact member 26 in the Z-direction is adjusted so that the center of the contact surface $26c$ is set at the neutral position $1d$ of the mold 1. More specifically, both the actuators $30a$ and $30b$ are driven in the same amount. With this operation, the position of the contact member 26 in the Z-direction is adjusted so that the center of the contact surface $26c$ is set at the neutral position $1d$ of the mold 1, without changing the angle ωy of the contact member 26. After the angle ωy and the position, in the Z-direction, of the contact member 26 are adjusted, the actuator 27 is activated to move through the lever 28 the contact member 26 in the direction (–X-direction) in which the mold 1 is pressed. As described above, the contact member 26 is supported by the base unit 25 through the members $29a$ and $29b$ which form the link mechanism, and therefore can be moved in the direction (–X-direction), in which the mold 1 is pressed from its side surface, without changing the angle ωy and the position in the Z-direction. In this manner, stress concentration that may occur locally in the pattern $1a$ of the mold 1 can be suppressed by adjusting the angle ωy and the position, in the Z-direction, of the contact member 26. Although the angle of the contact member 26 in the ωy-direction is adjusted by adopting a configuration which applies a force to the mold 1 in the X-direction (–X-direction) using the changing unit 24 in FIG. 8, the angle of the contact member 26 in the ωx-direction may be adjusted by adopting a configuration which applies a force to the mold 1 in the Y-direction (–Y-direction). Also, a distortion sensor, a force sensor, or a displacement sensor may be separately provided when the driving amounts of the actuators 27, $30a$, and $30b$ are controlled with high precision.

In step S70, the control unit 7 controls the mold driving unit 22 to press (imprint) the mold 1 against the resin 3 on the substrate 2 when the shape of the mold 1 has changed. In step S71, the control unit 7 controls the alignment measurement unit 8 to measure a position deviation between the alignment marks formed on the substrate 2 and mold 1, respectively, that has occurred in step S70. The control unit 7 controls the substrate stage 40 to reduce the position deviation measured by the alignment measurement unit 8 to move the substrate 2. In step S72, the control unit 7 controls the light irradiation unit 10 to irradiate the resin 3, against which the mold 1 is pressed, with the ultraviolet rays 5 to cure the resin 3. In step S73, the control unit 7 controls the mold driving unit 22 to separate (release) the mold 1 from the resin 3 on the substrate 2. In step S74, the control unit 7 determines whether a shot region in which a pattern is to be formed next remains on the substrate 2. If the next shot region remains, the process returns to step S64; otherwise, the process advances to step S75. In step S75, the control unit 7 controls the substrate conveyance mechanism (not shown) to recover the substrate 2 from the substrate chuck 41. In step S76, the control unit 7 determines whether a substrate to undergo an imprint process next remains. If the next substrate remains, the process returns to step S63; otherwise, the process advances to step S77. In step S77, the control unit 7 controls the mold conveyance mechanism (not shown) to recover the mold 1 from the mold chuck 21.

As described above, in the imprint apparatus 100 according to the first embodiment, the changing unit 24 which changes the shape of the pattern $1a$ of the mold 1 includes the adjusting unit 30 (actuator) which adjusts at least one of the angle and position of the contact member 26 which comes into contact with the side surface of the mold 1. With this arrangement, the contact surface $26c$ of the contact member 26 can be set parallel to the side surface of the mold 1, and the center of the contact surface $26c$ can be set at the neutral position of the mold 1. Therefore, in performing magnification correction of the pattern $1a$ by applying a force to the side surface of the mold 1, distortion of the mold 1 can be suppressed to reduce stress concentration that may occur locally in the pattern $1a$ of the mold 1, and, in turn, to overlay the mold 1 on the substrate 2 with high accuracy. Also, since the adjusting unit 30 (actuators $30a$ and $30b$) can be built into the changing unit 24, the space to place an adjusting unit can be saved to increase the number of changing units 24.

Figure 12:
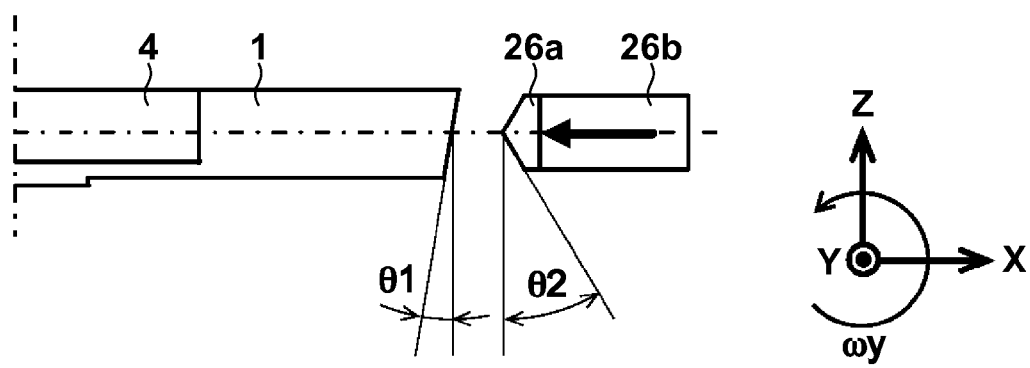
FIG. 12 is a view showing a modification to the first embodiment.

Note that as a modification to the above-mentioned embodiment, the distal end of the contact member 26 may be formed in a convex shape (for example, a mountain or spherical shape). FIG. 12 is a view illustrating an example in which the resin member $26a$ at the distal end of the contact member 26 is formed in a mountain shape. The resin member $26a$ has a ridgeline at the position where two flat surfaces intersect with each other. The ridgeline desirably falls within the range of 250 µm from the neutral position of the mold 1. Also, as shown in FIG. 12, the angle θ1 that the Y-Z plane (a plane perpendicular to the pattern portion) makes with the side surface of the mold 1, and the angle θ2 that the Y-Z plane makes with the distal end of the contact member 26 desirably satisfy θ1<θ2. The angle θ2 and the material of the resin member 26*a* can be appropriately set in consideration of a reduction in stress concentration, and the stroke of a magnification correction mechanism.

With this arrangement, the distal end of the contact member 26 is formed in a convex shape to make it easy to bring the contact member 26 into contact with the portion at the neutral position of the mold 1. Also, in terms of a reduction in stress concentration, the distal end of the contact member 26 desirably has a flat surface insofar as the distal end of the contact member 26 is expected to come into contact with the portion at the neutral position of the mold 1.

Second Embodiment

Figure 9:
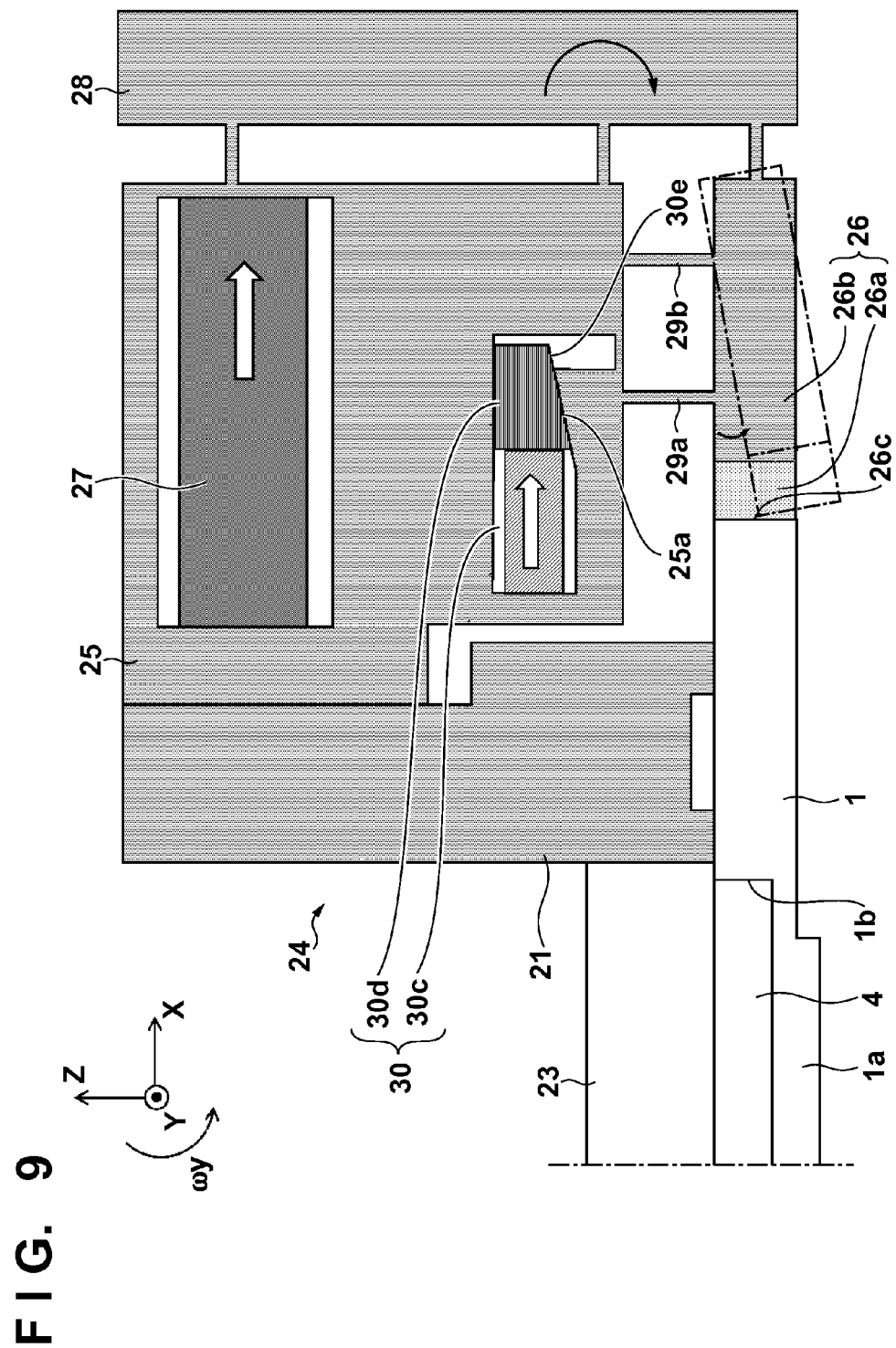
FIG. 9 is a sectional view showing a cross-section of a changing unit in the second embodiment.

An imprint apparatus according to the second embodiment of the present invention will be described with reference to FIG. 9. FIG. 9 is a sectional view showing a cross-section of a mold 1 and a changing unit 24 in the second embodiment. The imprint apparatus according to the second embodiment is different from the imprint apparatus 100 according to the first embodiment in the configuration of an adjusting unit 30, and in the former the adjusting unit 30 includes an actuator 30*c* and converting unit 30*d*. The actuator 30*c* applies a force in a direction (X-direction) opposite to that (first direction) in which a contact member 26 presses the mold 1 from its side surface. The converting unit 30*d* includes an inclined part 30*e*, and moves in the X-direction upon receiving a force generated by the actuator 30*c*. An inclined plane 25*a* is formed on a base unit 25 to be in contact with the inclined part 30*e* of the converting unit 30*d*, and have an angle of inclination corresponding to the inclined part 30*e*. As the converting unit 30*d* moves in the X-direction, a force in the first direction is converted into that in the second direction by the inclined part 30*e* of the converting unit 30*d*, and the inclined plane 25*a* of the base unit 25, so a member 29*a* can move in the –Z-direction. With this operation, the angle ωy of the contact member 26 can be adjusted, and a contact surface 26*c* of the contact member 26 can be set parallel to the side surface of the mold 1. Therefore, as in the imprint apparatus 100 according to the first embodiment, in performing magnification correction of a pattern 1*a* by applying a force to the side surface of the mold 1, distortion of the mold 1 can be suppressed, thus overlaying the mold 1 on a substrate 2 with high accuracy. Also, the imprint apparatus according to the second embodiment is effective when the angle of the contact member 26 is adjusted by increasing its resolution, using an actuator which produces a relatively small force and has a large stroke. Although the actuator 30*c* in the second embodiment applies a force in the X-direction, it may apply a force in the –X-direction.

Third Embodiment

Figure 10:
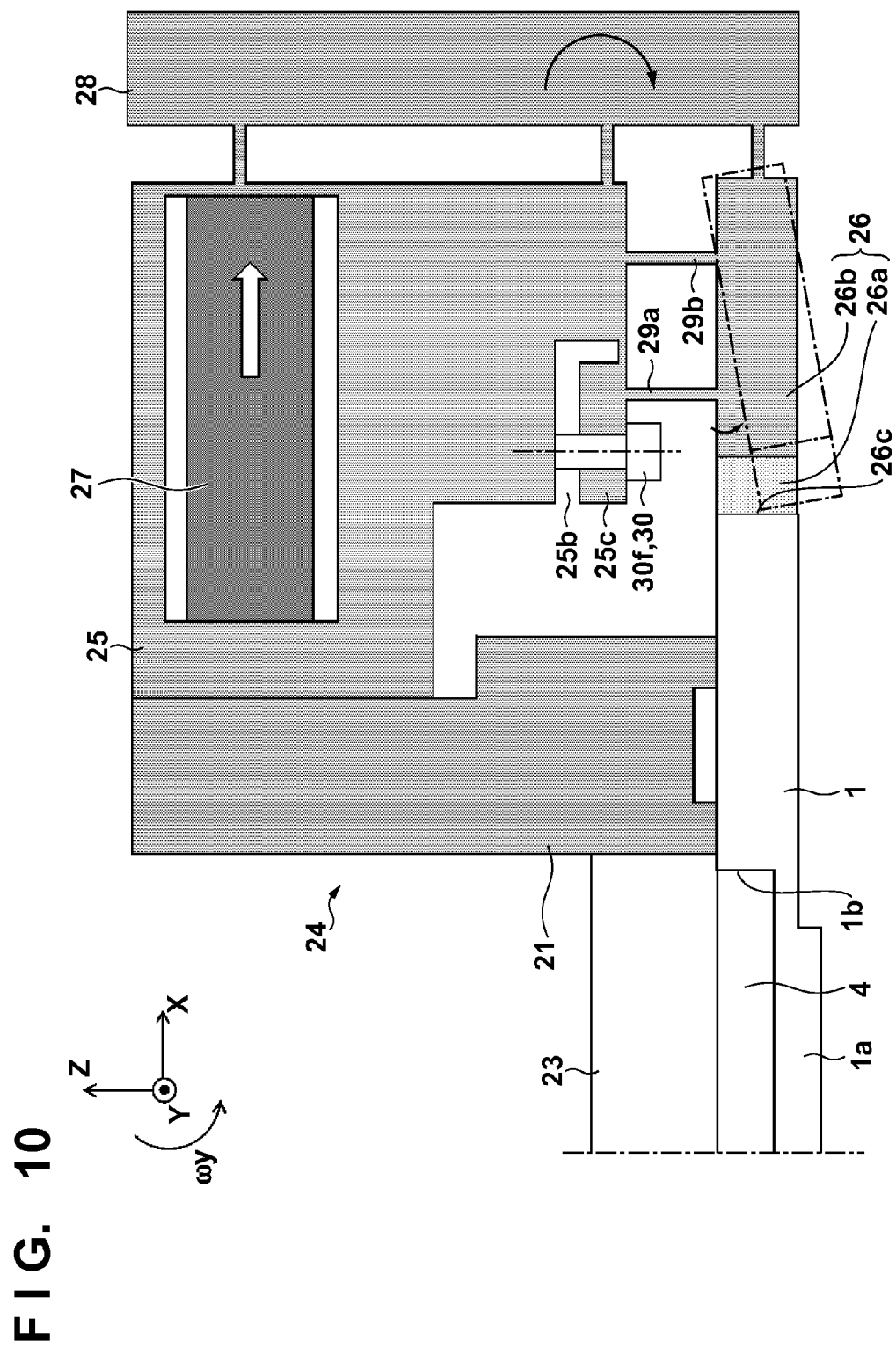
FIG. 10 is a sectional view showing a cross-section of a changing unit in the third embodiment.

An imprint apparatus according to the third embodiment of the present invention will be described with reference to FIG. 10. FIG. 10 is a sectional view showing a cross-section of a mold 1 and a changing unit 24 in the third embodiment. The imprint apparatus according to the third embodiment is different from the imprint apparatus 100 according to the first embodiment in the configuration of an adjusting unit 30, and in the former the adjusting unit 30 includes an actuator 30*f*. Also, a cut portion 25*b* is formed in a base unit 25 by cutting in the X-direction, so a portion 25*c* which supports a member 29*a* on the base unit 25 is formed thin by the cut portion 25*b*. The portion 25*c* of the base unit 25 is provided with the actuator 30*f*, and the member 29*a* can be moved in the –Z-direction by changing the width of the cut portion 25*b* by the actuator 30*f*. With this operation, an angle ωy of a contact member 26 can be adjusted, and a contact surface 26*c* of the contact member 26 can be set parallel to the side surface of the mold 1. Therefore, as in the imprint apparatus 100 according to the first embodiment, in performing magnification correction of a pattern 1*a* by applying a force to the side surface of the mold 1, distortion of the mold 1 can be suppressed, thus overlaying the mold 1 on a substrate 2 with high accuracy. Also, the imprint apparatus according to the third embodiment is effective when an actuator cannot be disposed on the member 29*a* because of an insufficient space. Note that in the third embodiment, adjustment may be manually done using a bolt in place of the actuator 30*f*. In this case, there is no need to use an actuator, so a simple, low-cost arrangement can be used. This arrangement is effective when the differences in shape between individual molds 1 are small, and only initial assembly and adjustment are performed.

Fourth Embodiment

Figure 11:
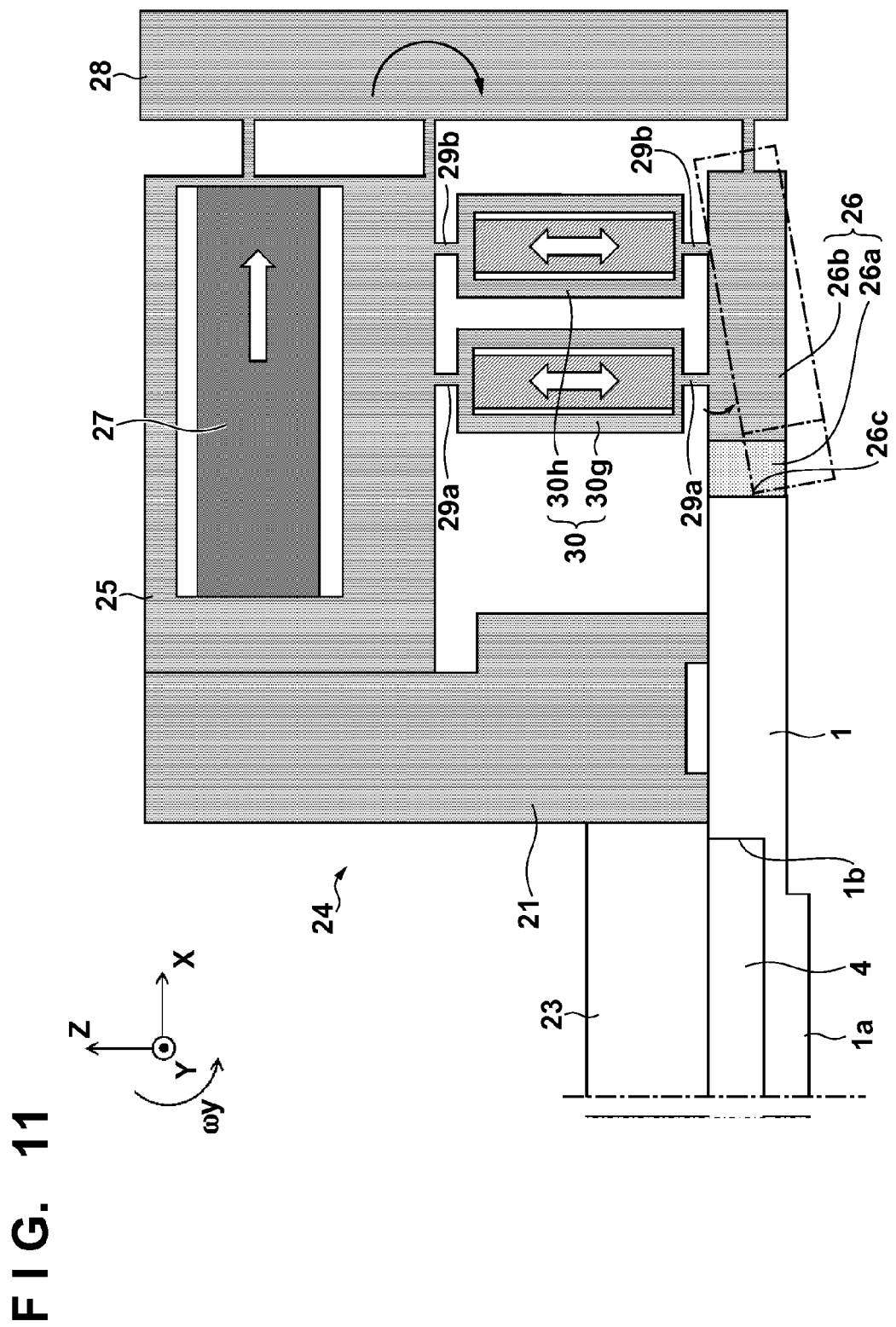
FIG. 11 is a sectional view showing a cross-section of a changing unit in the fourth embodiment.

An imprint apparatus according to the fourth embodiment of the present invention will be described with reference to FIG. 11. FIG. 11 is a sectional view showing a cross-section of a mold 1 and a changing unit 24 in the fourth embodiment. The imprint apparatus according to the fourth embodiment is different from the imprint apparatus 100 according to the first embodiment in the configuration of an adjusting unit 30, and in the former the adjusting unit 30 includes actuators 30*g* and 30*h*. The actuator 30*g* is disposed in the middle of a member 29*a*, and can change the distance between a base unit 25 and a contact member 26 upon driving it. This amounts to changing the length of the member 29*a*. Similarly, the actuator 30*h* is disposed in the middle of a member 29*b*, and can change the distance between the base unit 25 and the contact member 26 upon driving it. With this operation, an angle ωy of the contact member 26 can be adjusted, a contact surface 26*c* of the contact member 26 can be set parallel to the side surface of the mold 1, and the center of the contact surface 26*c* can be set at a neutral position 1*d* of the mold 1. Therefore, as in the imprint apparatus 100 according to the first embodiment, in performing magnification correction of a pattern 1*a* by applying a force to the side surface of the mold 1, distortion of the mold 1 can be suppressed, thus overlaying the mold 1 on a substrate 2 with high accuracy. Also, the imprint apparatus according to the fourth embodiment is effective when the space to place an actuator is narrow, members cannot reliably have sufficient lengths, and a link mechanism can hardly be formed.

<Embodiment of Method of Manufacturing Article>

A method of manufacturing an article according to an embodiment of the present invention is suitable for manufacturing various articles including a microdevice such as a semiconductor device and an element having a microstructure. The method of manufacturing an article according to this embodiment includes a step of forming a pattern on a resin, dispensed on a substrate, using the above-mentioned imprint apparatus (a step of performing an imprint process on a substrate), and a step of processing the substrate having the pattern formed on it in the forming step. This manufacturing method also includes subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-107035, filed on May 8, 2012 and 2013-078096, filed Apr. 3, 2013, which are hereby incorporated by reference herein in their entirety.

What is claimed is:

1. An imprint apparatus which forms a pattern to an imprint material on a substrate using a mold, the apparatus comprising:
    a changing unit which includes a contact member having a contact surface that comes into contact with a side surface of the mold, and is configured to apply a force to the side surface of the mold through the contact member to change a shape of the mold; and
    an adjusting unit configured to adjust an angle of the contact member to change a relative angle between the contact surface and the side surface of the mold.

2. The apparatus according to claim 1, wherein
    the contact member is supported through a plurality of members by a base unit fixed to a holding unit configured to hold the mold, and
    the plurality of members form a link mechanism which allows the contact member to move in a first direction in which the contact member presses the mold.

3. The apparatus according to claim 2, wherein the adjusting unit is disposed on the base unit, and drives at least one of the plurality of members in a second direction different from the first direction.

4. The apparatus according to claim 3, wherein the adjusting unit includes an actuator configured to drive at least one of the plurality of members in the second direction.

5. The apparatus according to claim 3, wherein
    the adjusting unit includes a converting unit including an inclined part, and an actuator configured to apply a force in the first direction to the converting unit,
    the base unit includes an inclined plane in contact with the inclined part, and
    the converting unit converts the force in the first direction into a force in the second direction using the inclined part and the inclined plane to drive at least one of the plurality of members in the second direction.

6. The apparatus according to claim 2, wherein
    the adjusting unit includes an actuator disposed on at least one of the plurality of members, and
    the actuator is disposed on at least one of the plurality of members to be capable of changing a distance between the base unit and the contact member.

7. The apparatus according to claim 1, wherein
    the adjusting unit adjusts the angle of the contact member based on shape information of the mold, and
    the shape information includes a tilt of the side surface of the mold.

8. The apparatus according to claim 1, further comprising:
    a measurement unit configured to measure a position deviation between an alignment mark formed on the mold, and an alignment mark formed on the substrate,
    wherein the adjusting unit adjusts the angle of the contact member to reduce the position deviation measured by the measurement unit.

9. The apparatus according to claim 1, further comprising:
    a measurement unit configured to measure a deformation amount in which an outer peripheral region of the mold deforms in a direction, different from the direction in which the mold is pressed, upon applying a force to the side surface of the mold by the changing unit,
    wherein the outer peripheral region includes a region that falls outside a portion held by a holding unit in the mold, and
    the adjusting unit adjusts the angle of the contact member to reduce the deformation amount measured by the measurement unit.

10. The apparatus according to claim 1, wherein a distal end of the contact member has a convex shape.

11. The apparatus according to claim 1, wherein the adjusting unit adjusts the angle of the contact member such that the contact surface and the side surface of the mold are in parallel to each other.

12. The apparatus according to claim 1, wherein the adjusting unit moves the contact member in a direction in which the contact member presses the mold, while maintaining the angle of the contact member.

13. The apparatus according to claim 1, wherein
    the contact member is supported through a plurality of members by a base unit fixed to a holding unit configured to hold the mold, and
    the adjusting unit adjusts the angle of the contact member by individually driving the plurality of members in a direction in which the mold presses the imprint material.

14. The apparatus according to claim 1, wherein the adjusting unit further adjusts a position of the contact member.

15. The apparatus according to claim 1, wherein the adjusting unit further adjusts a position of the contact member in a direction in which the mold presses the imprint material.

16. An imprint apparatus which forms a pattern to an imprint material on a substrate using a mold, the apparatus comprising:
    a changing unit which includes a contact member having a contact surface that comes into contact with a side surface of the mold, and is configured to apply a force to the side surface of the mold through the contact member to change a shape of the mold; and
    an adjusting unit configured to adjust a position of the contact member in a direction in which the mold presses the imprint material to change a relative position between the contact member and the side surface of the mold.

17. The apparatus according to claim 16, wherein
    the contact member is supported through a plurality of members by a base unit fixed to a holding unit configured to hold the mold, and
    the plurality of members form a link mechanism which allows the contact member to move in the direction in which the contact member presses the mold.

18. The apparatus according to claim 17, wherein the adjusting unit is disposed on the base unit, and drives at least one of the plurality of members in a second direction different from the direction.

19. The apparatus according to claim 18, wherein the adjusting unit includes an actuator configured to drive at least one of the plurality of members in the second direction.

20. The apparatus according to claim 18, wherein
the adjusting unit includes a converting unit including an inclined part, and an actuator configured to apply a force in the direction to the converting unit,
the base unit includes an inclined plane in contact with the inclined part, and
the converting unit converts the force in the direction into a force in the second direction using the inclined part and the inclined plane to drive at least one of the plurality of members in the second direction.

21. The apparatus according to claim 17, wherein
the adjusting unit includes an actuator disposed on at least one of the plurality of members, and
the actuator is disposed on at least one of the plurality of members to be capable of changing a distance between the base unit and the contact member.

22. The apparatus according to claim 16, wherein
the adjusting unit adjusts the position of the contact member based on shape information of the mold, and
the shape information includes a thickness of the mold.

23. The apparatus according to claim 16, further comprising:
a measurement unit configured to measure a position deviation between an alignment mark formed on the mold, and an alignment mark formed on the substrate, wherein the adjusting unit adjusts the contact member to reduce the position deviation measured by the measurement unit.

24. The apparatus according to claim 16, further comprising:
a measurement unit configured to measure a deformation amount in which an outer peripheral region of the mold deforms in a direction, different from the direction in which the mold is pressed, upon applying a force to the side surface of the mold by the changing unit,
wherein the outer peripheral region includes a region that falls outside a portion held by a holding unit in the mold, and
the adjusting unit adjusts the contact member to reduce the deformation amount measured by the measurement unit.

25. The apparatus according to claim 16, wherein a distal end of the contact member has a convex shape.

26. The apparatus according to claim 16, wherein the adjusting unit adjusts the position of the contact member such that a center of the contact surface is set at a neutral position of the mold.

27. The apparatus according to claim 16, wherein
the contact member is supported through a plurality of members by a base unit fixed to a holding unit configured to hold the mold, and
the adjusting unit adjusts the position of the contact member by driving, in a same amount, the plurality of members in the direction.

* * * * *